(12) United States Patent
Liao

(10) Patent No.: US 11,972,998 B2
(45) Date of Patent: Apr. 30, 2024

(54) SEMICONDUCTOR PACKAGE DEVICE WITH DEDICATED HEAT-DISSIPATION FEATURE AND METHOD OF MANUFACTURING SEMICONDUCTOR PACKAGE DEVICE

(71) Applicant: SHUNSIN TECHNOLOGY (ZHONG SHAN) LIMITED, Zhongshan (CN)

(72) Inventor: Shun-Hsing Liao, Zhongshan (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 228 days.

(21) Appl. No.: 17/536,328

(22) Filed: Nov. 29, 2021

(65) Prior Publication Data

US 2023/0130484 A1    Apr. 27, 2023

(30) Foreign Application Priority Data

Oct. 22, 2021    (CN) .......................... 202111235820.5

(51) Int. Cl.
| | | |
|---|---|---|
| H01L 23/367 | (2006.01) | |
| H01L 21/48 | (2006.01) | |
| H01L 21/56 | (2006.01) | |
| H01L 23/31 | (2006.01) | |

(Continued)

(52) U.S. Cl.
CPC ........ H01L 23/367 (2013.01); H01L 21/4871 (2013.01); H01L 21/56 (2013.01); H01L 23/3157 (2013.01); H01L 23/373 (2013.01); H01L 23/3731 (2013.01); H01L 23/3736 (2013.01); H01L 23/49816 (2013.01); H01L 23/49822 (2013.01)

(58) Field of Classification Search
CPC . H01L 23/367; H01L 23/3157; H01L 23/373; H01L 23/3731; H01L 23/3736; H01L 23/49816; H01L 23/49822; H01L 21/56
See application file for complete search history.

(56) References Cited

U.S. PATENT DOCUMENTS

| | | |
|---|---|---|
| 7,271,479 B2 | 9/2007 | Zhao et al. |
| 8,999,760 B2 | 4/2015 | Pagaila et al. |

(Continued)

FOREIGN PATENT DOCUMENTS

| | | |
|---|---|---|
| EP | 2555240 B1 | 4/2020 |
| TW | 200847351 A | 12/2008 |

(Continued)

*Primary Examiner* — Peniel M Gumedzoe
(74) *Attorney, Agent, or Firm* — ScienBiziP, P.C.

(57) ABSTRACT

A miniaturized and high-power semiconductor package device with its own heat-dissipating ability includes a thermal conductor, a redistribution layer, an electronic device, a molding layer, and a solder ball. The redistribution layer includes a first surface defining an opening, a second surface opposite to the first surface, and a circuit layer. The thermal conductor is disposed in the opening. The electronic device is disposed on the first surface of the redistribution layer above the thermal conductor. The molding layer is formed on the first surface and surrounding the electronic device. The solder balls are disposed on the second surface of the redistribution layer and can form electrical connections to the circuit layer.

12 Claims, 6 Drawing Sheets

(51) Int. Cl.
    *H01L 23/373*    (2006.01)
    *H01L 23/498*    (2006.01)

(56) References Cited

U.S. PATENT DOCUMENTS

| | | | |
|---|---|---|---|
| 2010/0176503 A1* | 7/2010 | Lee | H01L 23/4334 |
| | | | 257/713 |
| 2014/0251658 A1* | 9/2014 | Lin | H05K 1/0271 |
| | | | 174/252 |
| 2017/0263546 A1* | 9/2017 | Lin | H05K 1/0204 |
| 2019/0131221 A1* | 5/2019 | Lee | H01L 23/49811 |
| 2020/0176416 A1 | 6/2020 | Ketterson et al. | |
| 2021/0183722 A1 | 6/2021 | Anderson et al. | |
| 2021/0313284 A1 | 10/2021 | Noori et al. | |

FOREIGN PATENT DOCUMENTS

| | | |
|---|---|---|
| TW | I691025 B | 4/2020 |
| TW | 202139298 A | 10/2021 |

* cited by examiner

SEMICONDUCTOR PACKAGE DEVICE WITH DEDICATED HEAT-DISSIPATION FEATURE AND METHOD OF MANUFACTURING SEMICONDUCTOR PACKAGE DEVICE

FIELD

The subject matter herein generally relates to chip manufacture, particularly to temperature control in semiconductor package devices and methods of manufacturing the semiconductor package devices.

BACKGROUND

As the functions of instruments increase, semiconductor devices not only become smaller but also consume more electrical energy. The management of heat generated by miniaturized packaging structure becomes more difficult with reduced chip sizes, but temperature control is necessary for reliable performance.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
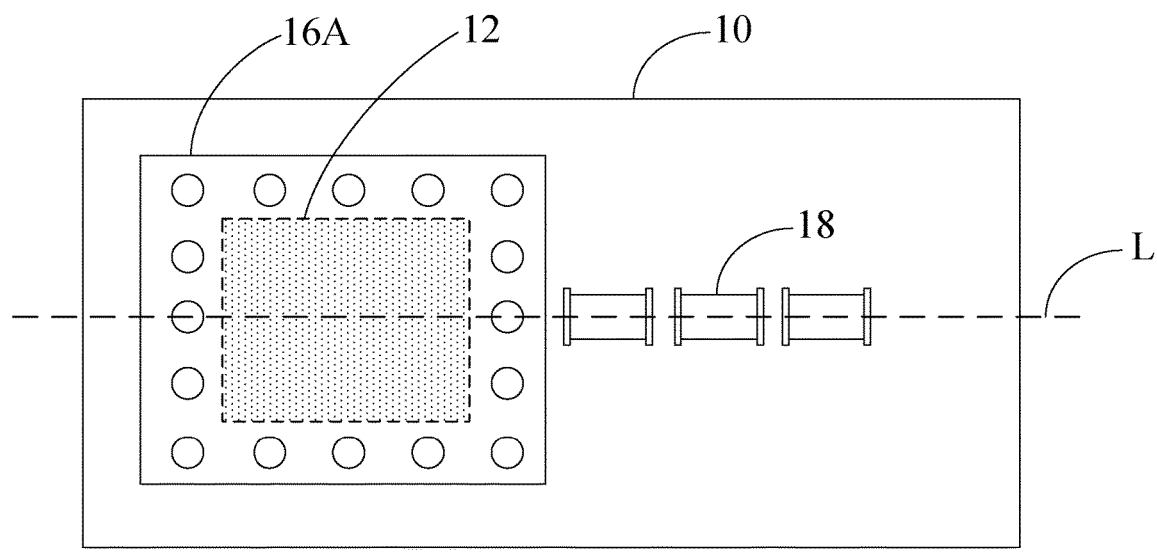
FIG. 1 is a top view of a semiconductor package device according to an embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one".

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
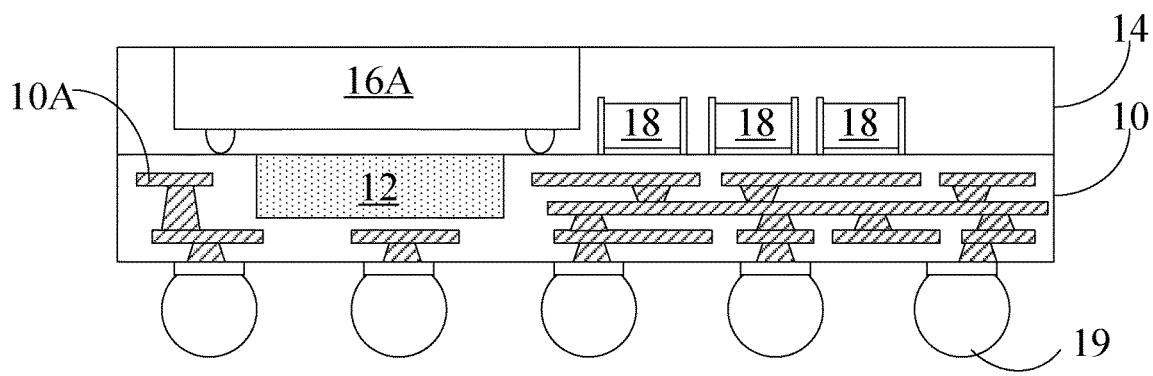
FIG. 2 is a schematic cross-sectional diagram of a semiconductor package device according to an embodiment of the disclosure.

FIG. 1 illustrates a top view of a semiconductor package device (semiconductor package device 100A) according to an embodiment of the disclosure. FIG. 2 is a cross-sectional view of semiconductor package device 100A taken along line L of FIG. 1. The semiconductor package device 100A comprises a redistribution layer 10, a thermal conductor 12, a molding layer 14, an electronic device 16A, electronic components 18, and solder balls 19 for electrical connection purposes. For clarity of description, in FIG. 1, the molding layer 14 and the solder balls 19 are omitted.

In FIG. 2, the redistribution layer 10 has a circuit layer 10A. According to an embodiment of the disclosure, the redistribution layer 10 can be formed layer by layer on a carrier first, then the carrier is removed after the formation of the redistributed layer 10 is completed. The formation of the redistribution layer 10 may involve multiple deposition or coating processes, patterning processes, and planarization processes. The deposition or coating processes can form insulating layers or the circuit layers 10A. The deposition or coating processes may comprise a spin coating process, an electroplating process, an electroless process, a chemical vapor deposition (CVD) process, a physical vapor deposition (PVD) process, an atomic layer deposition (ALD) process, and other applicable process and combinations thereof. The patterning process can be used to pattern the formed insulating layers and circuit layers 10A. The patterning process may comprise a photolithography process, an energy beam drilling process (for example, a laser beam drilling process, an ion beam drilling process, or an electron beam drilling process), an etching process, a mechanical drilling process, or other applicable processes and combinations. The planarization process can be used to provide a flat top surface for the formed insulating layers and circuit layers 10A to facilitate subsequent processes. The planarization process may comprise a mechanical polishing process, a chemical mechanical polishing (CMP) process, or other applicable process and combinations thereof. In an embodiment of the disclosure, an opening is formed in the insulating layer of the redistribution layer 10 by mechanical drilling, etching, or laser drilling. The opening is to enclose the thermal conductor 12.

The redistribution layer 10 can also be formed by an additive buildup process. The additive buildup process may comprise the alternating stacking of one or more dielectric layers and conductive patterns or traces of the circuit layers 10A. The conductive patterns or traces fan the electrical traces out of the occupied space of the electronic device, or are in a fan-shaped layout allowing the electrical traces into the occupied space of the electronic device. The conductive patterns can be formed by a plating process such as an electroplating process or an electroless plating process. The conductive pattern may comprise a conductive material, such as copper or other plateable metals. The dielectric layer of the redistribution layer 10 can be made of a photo-definable organic dielectric such as polyimide (PI), benzocyclobutene (BCB), or polybenzoxazole (PBO). In other embodiments, the dielectric material of the redistribution layer 10 may also be an inorganic dielectric layer. The inorganic dielectric layer may comprise silicon nitride ($Si_3N_4$), silicon oxide ($SiO_2$), or SiON. The inorganic dielectric layer can be formed by growing an inorganic dielectric layer using an oxidation or nitridation process.

According to the embodiment of the disclosure, the redistribution layer 10 may further comprise a carrier, for example, a printed circuit board (PCB) or a laminated substrate. The carrier can be formed by laminating and build-up methods, which are wholly conventional and will be fully appreciated by those of ordinary skill in the art. The material of the dielectric structure inside the carrier may comprise epoxy resin, phenolic resin, glass epoxy resin, polyimide, polyester, epoxy molding compound, or ceramic. The material of the wires inside the carrier may comprise copper, iron, nickel, gold, silver, palladium, or tin.

The thermal conductor 12 is disposed in the opening of the redistribution layer 10 and is formed of a material with high thermal conductivity. The thermal conductivity can be in the range of 50 to 5300 W/mK. According to an embodiment of the disclosure, the material of the thermal conductor 12 may comprise copper, copper alloy, ceramic, graphene, graphite, carbon nanotube (CNT), carbon nanospheres, and aluminum nitride (AlN), or a combination thereof.

The bottom (second surface) of the redistribution layer 10 has solder balls 19 electrically connected to the circuit layer 10A. The solder balls 19 can be disposed on the bottom of the redistribution layer 10 by ball implantation. The semiconductor package device 100A according to an embodiment of the disclosure can be electrically connected to an external device (such as a printed circuit board) by these solder balls 19.

As shown in FIGS. 1-2, an electronic device 16A and electronic components 18 are provided on the top (first side) of the redistribution layer 10. In FIGS. 1-2, only a single electronic device 16A and three electronic components 18 are shown. However, the actual number is not limited to these, and those with need can set a specific number of electronic devices 16 and electronic components 18. The electronic device 16A may be a semiconductor die, a semiconductor chip, or a package including a plurality of electronic devices. The electronic device 16A may be connected to the circuit layer 10A of the redistribution layer 10 via conductive wires such as gold wires, copper wires, or aluminum wires. According to the embodiment of the disclosure, the electronic device 16A is disposed above the thermal conductor 12, so the heat of the electronic device 16A can be dissipated by the thermal conductor 12. The electronic device 16A may be optoelectronic devices, microelectromechanical systems (MEMS), power amplifier chips, power management chips, biological identification devices, microfluidic systems, or a physical sensor that measures the changes in physical quantities such as heat, light, and pressure. The electronic device 16A also can also comprise semiconductor chips such as imaging sensor devices, light-emitting diodes (LEDs), solar cells, accelerators, gyroscopes, fingerprint readers, micro actuators, surface acoustic wave devices, or process sensors or ink printer heads made by a wafer scale package (WSP) process. The electronic components 18 may be electrically connected to the circuit layer 10A of the redistribution layer 10. According to an embodiment of the disclosure, an electronic component 18 may be a passive component, such as a resistor, a capacitor, an inductor, a filter, an oscillator, and so on. In other embodiments, the electronic component 18 may also be an electronic terminal.

The electronic device 16A and the electronic components 18 can be disposed on the top (first side) of the redistribution layer 10 by a flip-chip packaging, and are electrically connected to the circuit layer 10A in the redistribution layer 10. In addition, the electronic device 16A and the electronic components 18 can also be disposed on the top (first side) of the redistribution layer 10 through an adhesive layer, and electrically connected to the circuit layer 10A in the redistribution layer 10 by wire bonding.

According to an embodiment of the disclosure, the adhesive layer can be formed of various materials, including a polyimide (PI), polyethylene terephthalate (PET), Teflon, liquid crystal polymer (LCP), polyethylene (PE), polypropylene (PP), polystyrene (PS), polyvinyl chloride (PVC), nylon or polyamides, polymethylmethacrylate (PMMA), acrylonitrile-butadiene-styrene, phenolic resins, epoxy resin, polyester, silicone, polyurethane (PU), polyamide-imide (PAI) or a combination thereof, not being limited thereto, as long as such materials have the required adhesive properties.

The molding layer 14 is formed on the redistribution layer 10, surrounds the electronic device 16A, and exposes the top surface of the electronic device 16A. The molding layer 14 also covers the electronic components 18. According to an embodiment of the disclosure, the material of the molding layer 14 can be epoxy resin, cyanate resin, bismaleimide triazine, glass fiber, polybenzoxazole, polyimide, nitride (for example, silicon nitride), oxide (for example, silicon oxide), silicon oxynitride, or similar insulating materials, insulating organic material mixed with epoxy resin and glass fiber, or ceramic material.

Figure 3:
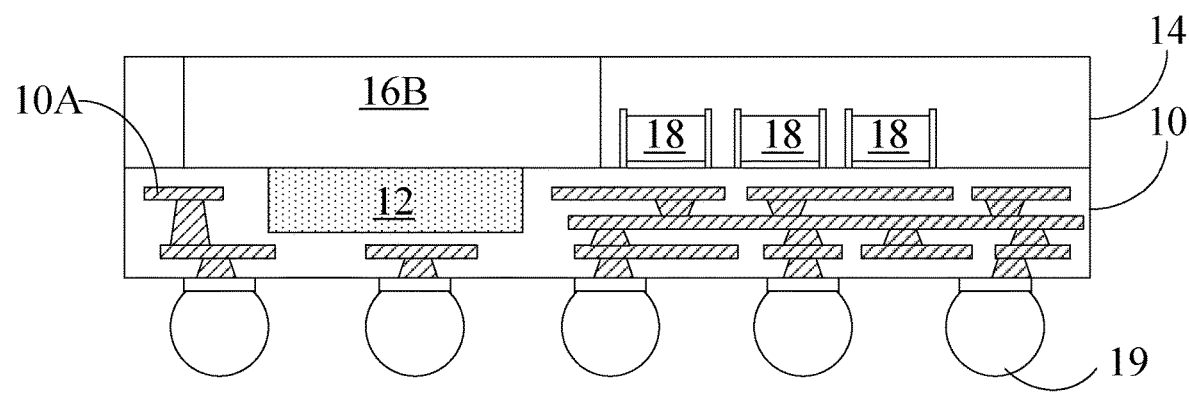
FIG. 3 is a schematic cross-sectional diagram of a semiconductor package device according to another embodiment of the disclosure.

FIG. 3 illustrates a semiconductor package device according to another embodiment of the disclosure (semiconductor package device 100B). The difference between the semiconductor package device 100B and the semiconductor package device 100A shown in FIG. 2 is that the electronic device 16B is mounted on the top (first side) of the redistribution layer 10 using surface mount technology (SMT), so the electronic device 16B can be in direct contact with the thermal conductor 12. Through conduction, the heat of the electronic device 16B is dissipated efficiently by the thermal conductor 12. The remaining structure of the semiconductor package device 100B is the same as that of the semiconductor package device 100A shown in FIG. 2.

Figure 4:
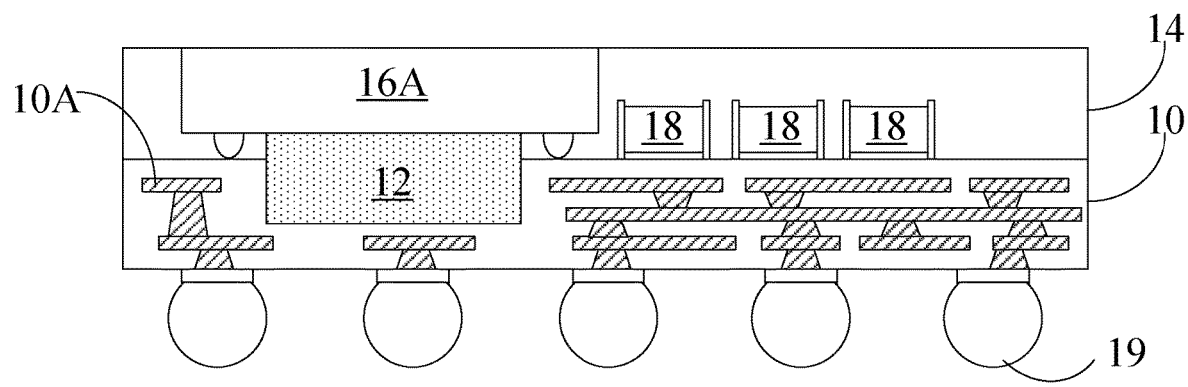
FIG. 4 is a schematic cross-sectional diagram of a semiconductor package device according to another embodiment of the disclosure.

FIG. 4 illustrates a semiconductor package device according to another embodiment of the disclosure (semiconductor package device 100C). The difference between the semiconductor package device 100C and the semiconductor package device 100A shown in FIG. 2 is that the thermal conductor 12 extends beyond the top (first side) of the redistribution layer 10 and is in contact with the electronic device 16A. Since the electronic device 16A is directly in contact with the thermal conductor 12, the heat of the electronic device 16A is dissipated efficiently through conduction by the thermal conductor 12. The remaining structure of the semiconductor package device 100C is the same as that of the semiconductor package device 100A shown in FIG. 2.

Figure 5:
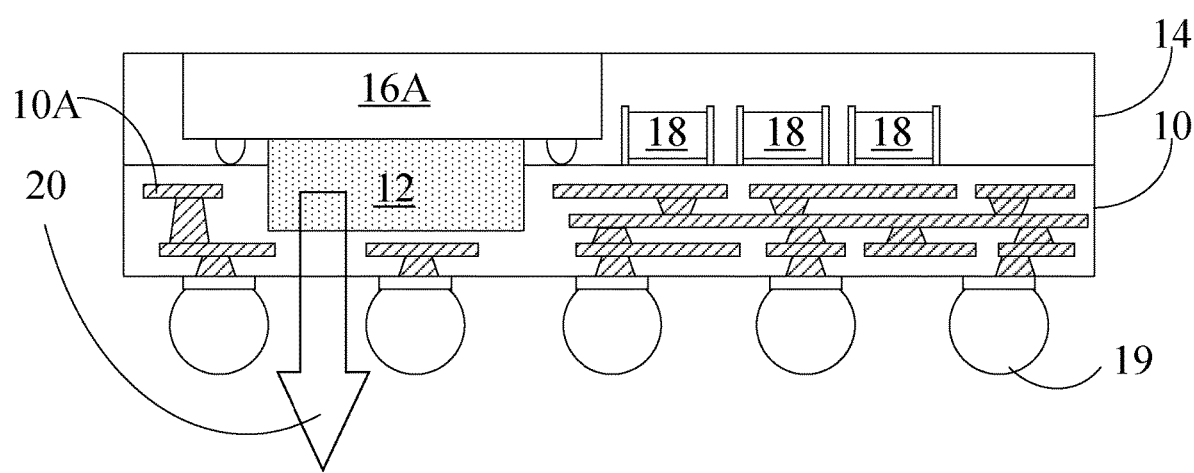
FIG. 5 is a schematic diagram of the semiconductor package device with heat dissipation configuration according to an embodiment of the disclosure.

FIG. 5 illustrates heat dissipation layout of the semiconductor package device according to an embodiment of the disclosure. As shown in FIG. 5, the heat generated by the electronic device 16A can be dissipated from the heat dissipation direction 20 to the bottom of the redistribution layer 10 through the thermal conductor 12, effectively improving the heat dissipation efficiency of the semiconductor package device. In addition, since the thermal conductivity of the molding layer 14 is 3-5 W/m*K, and the circuit layer 10A of the redistribution layer 10 has a relatively small heat dissipation area, the thermal conductivity of the thermal conductor 12 made of copper is 375 W/m*K or more, so the heat dissipation efficiency of the semiconductor package device is improved. Moreover, the thermal conductor 12 being embedded in the redistribution layer 10 reinforces the structural stability of the redistribution layer 10 to prevent the redistribution layer 10 from cracking, further improving the reliability of the product.

Figure 6A:
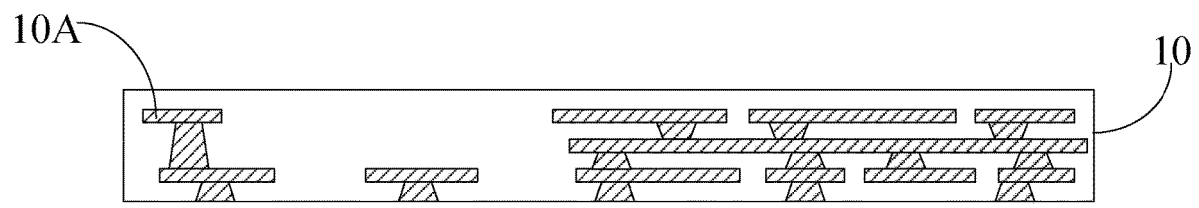
FIGS. 6A, 6B, 6C, 6D, 6E and 6F are schematic cross-sectional diagrams illustrating a process flow of a method of manufacturing a semiconductor package device according to an embodiment of the disclosure.

FIGS. 6A-6F illustrate other embodiments for implementation of the method of the disclosure. In FIG. 6A, a redistribution layer 10 is provided. The redistribution layer 10 comprises a circuit layer 10A. According to an embodiment of the disclosure, the redistribution layer 10 can be formed layer by layer on a carrier first, then the carrier is removed after the formation of the redistributed layer 10 is completed. The formation of the redistribution layer 10 may involve multiple deposition or coating processes, patterning processes, and planarization processes. The deposition or coating processes can be used to form insulating layers or the circuit layers 10A. The deposition or coating processes may comprise a spin coating process, an electroplating process, an electroless process, a chemical vapor deposition (CVD) process, a physical vapor deposition (PVD) process, an atomic layer deposition (ALD) process, and other applicable process and combinations thereof. The patterning process can be used to pattern the formed insulating layers and circuit layers 10A. During the patterning process, a position for the thermal conductor 12 is reserved in the insulating layer. The patterning process may comprise a photolithography process, an energy beam drilling process (for example, a laser beam drilling process, an ion beam drilling process, or an electron beam drilling process), an etching process, a mechanical drilling process, or other applicable process and combinations. The planarization process can be used to provide a flat top surface for the formed insulating layers and circuit layers 10A to facilitate subsequent processes. The planarization process may comprise a mechanical polishing process, a chemical mechanical polishing (CMP) process, or other applicable processes and combinations thereof.

The redistribution layer 10 can also be formed by an additive buildup process. The additive buildup process may comprise the alternating stacking of one or more dielectric layers and conductive patterns or traces of the circuit layers 10A. The conductive patterns or traces can fan the electrical traces out of the occupied space of the electronic device, or can fan the electrical traces into the occupied space of the electronic device. The conductive patterns can be formed by a plating process such as an electroplating process or an electroless plating process. The conductive pattern may comprise a conductive material, such as copper or other plateable metals. The dielectric layer of the redistribution layer 10 can be made of a photo-definable organic dielectric such as polyimide (PI), benzocyclobutene (BCB), or polybenzoxazole (PBO). In other embodiments, the dielectric material of the redistribution layer 10 may also be an inorganic dielectric layer. The inorganic dielectric layer may comprise silicon nitride ($Si_3N_4$), silicon oxide ($SiO_2$), or SiON. The inorganic dielectric layer can be formed by growing an inorganic dielectric layer using an oxidation or nitridation process.

According to the embodiment of the disclosure, the redistribution layer 10 may further comprise a carrier, for example, a printed circuit board (PCB) or a laminated substrate. The carrier can be formed by laminating and build-up methods, which are wholly conventional. The material of the dielectric structure inside the carrier may comprise epoxy resin, phenolic resin, glass epoxy resin, polyimide, polyester, epoxy molding compound, or ceramic. The material of the wires inside the carrier may comprise copper, iron, nickel, gold, silver, palladium, or tin.

Figure 6B:
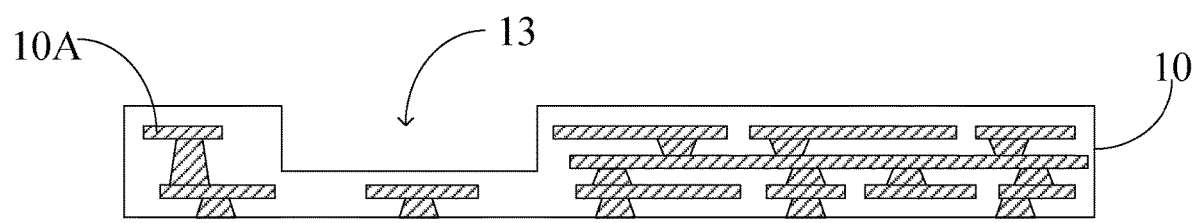
Figure 6C:
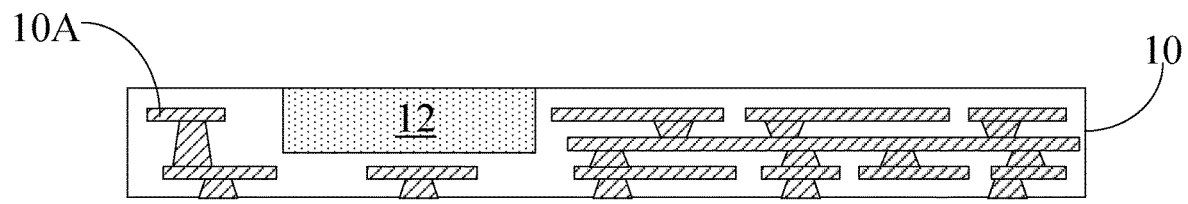

Next, as shown in FIG. 6B, an opening 13 is formed in the insulating layer of the redistribution layer 10 by mechanical drilling, etching, or laser drilling. The opening is to be placed the thermal conductor 12. Next, as shown in FIG. 6C, the thermal conductor 12 is disposed in the opening 13 of the redistribution layer 10 and is formed of a material with high thermal conductivity. The thermal conductivity can be in the range of 50 to 5300 W/mK. According to an embodiment of the disclosure, the material of the thermal conductor 12 may comprise copper, copper alloy, ceramic, graphene, graphite, carbon nanotube (CNT), carbon nanospheres, and aluminum nitride (AlN), or a combination thereof.

Figure 6D:
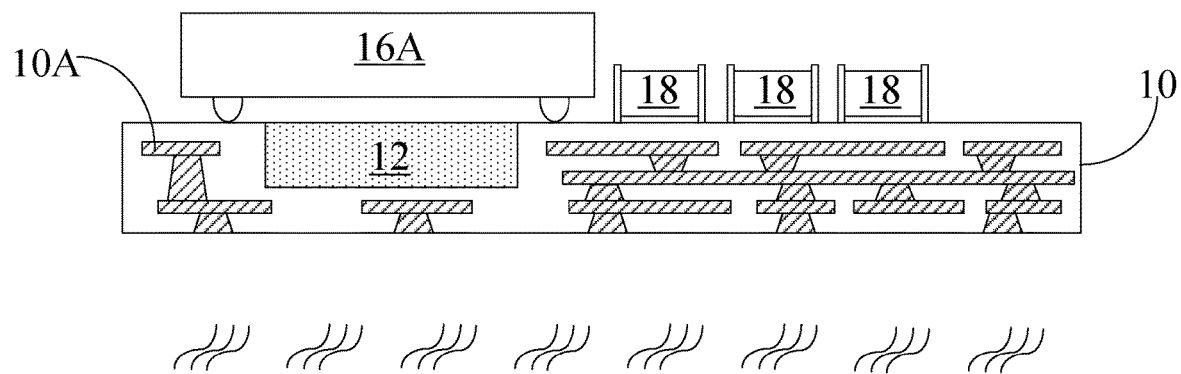

Next, as shown in FIG. 6D, an electronic device 16A and electronic components 18 are installed on the top (first side) of the redistribution layer 10. In FIG. 6D, only single electronic device 16A and three electronic components 18 are shown. However, the actual number is not limited thereto, and a specific number of electronic devices 16A and electronic components 18 can be set according to actual needs. The electronic device 16A may be a semiconductor die, a semiconductor chip, or a package including a plurality of electronic devices. The electronic device 16A may be connected to the circuit layer 10A of the redistribution layer 10 via conductive wires such as gold wires, copper wires, or aluminum wires. According to an embodiment of the disclosure, the electronic device 16A is disposed above the thermal conductor 12, so the heat of the electronic device 16A can be dissipated. The electronic device 16A may be optoelectronic devices, micro-electromechanical systems (MEMS), power amplifier chips, power management chips, biological identification devices, microfluidic systems, or a physical sensor that measures the changes in physical quantities such as heat, light, and pressure. The electronic device 16A also can also comprise semiconductor chips such as imaging sensor devices, light-emitting diodes (LEDs), solar cells, accelerators, gyroscopes, fingerprint readers, micro actuators, surface acoustic wave devices, process sensors or ink printer heads made by a wafer scale package (WSP) process. The electronic components 18 may be electrically connected to the circuit layer 10A of the redistribution layer 10. According to an embodiment of the disclosure, an electronic component 18 may be a passive component, such as a resistor, a capacitor, an inductor, a filter, an oscillator, and so on. In other embodiments, the electronic component 18 may also be an electronic terminal.

The electronic device 16A and the electronic components 18 can be disposed on the top (first side) of the redistribution layer 10 by a flip-chip packaging, and are electrically connected to the circuit layer 10A in the redistribution layer 10. In addition, the electronic device 16A and the electronic components 18 can also be disposed on the top (first side) of the redistribution layer 10 through an adhesive layer, and electrically connected to the circuit layer 10A in the redistribution layer 10 by wire bonding.

According to an embodiment of the disclosure, the adhesive layer can be formed of various materials, including a polyimide (PI), polyethylene terephthalate (PET), Teflon, liquid crystal polymer (LCP), polyethylene (PE), polypropylene (PP), polystyrene (PS), polyvinyl chloride (PVC), nylon or polyamides, polymethylmethacrylate (PMMA), acrylonitrile-butadiene-styrene, phenolic resins, epoxy resin, polyester, silicone, polyurethane (PU), polyamide-imide (PAI) or a combination thereof, not being limited thereto, as long as such materials have the required adhesive properties. Next, the semi-finished product is baked to cure the adhesive layer for fixing the electronic device 16A and the electronic components 18 on the circuit redistribution layer 10.

Figure 6E:
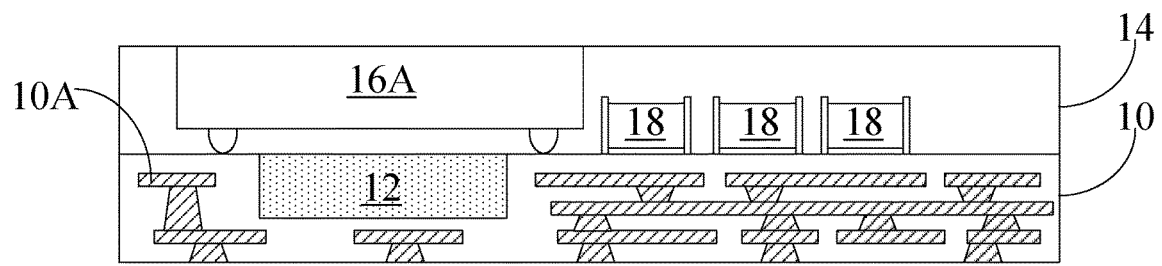

Next, in FIG. 6E, the molding layer 14 is formed on the redistribution layer 10 and covers the electronic device 16A and the electronic components 18. The molding layer 14 is then polished by a planarization process until the top of the electronic device 16A is exposed. As shown in FIG. 6E, the electronic components 18 are still covered by the molding layer 14. According to the embodiment of the disclosure, the planarization process may comprise a mechanical polishing process, a chemical mechanical polishing (CMP) process, or other applicable process and combinations thereof. According to an embodiment of the disclosure, the material of the molding layer 14 can be epoxy resin, cyanate resin, bismaleimide triazine, glass fiber, polybenzoxazole, polyimide, nitride (for example, silicon nitride), oxide (for example, silicon oxide), silicon oxynitride, or similar insulating materials, insulating organic material mixed with epoxy resin and glass fiber, or ceramic material.

Figure 6F:
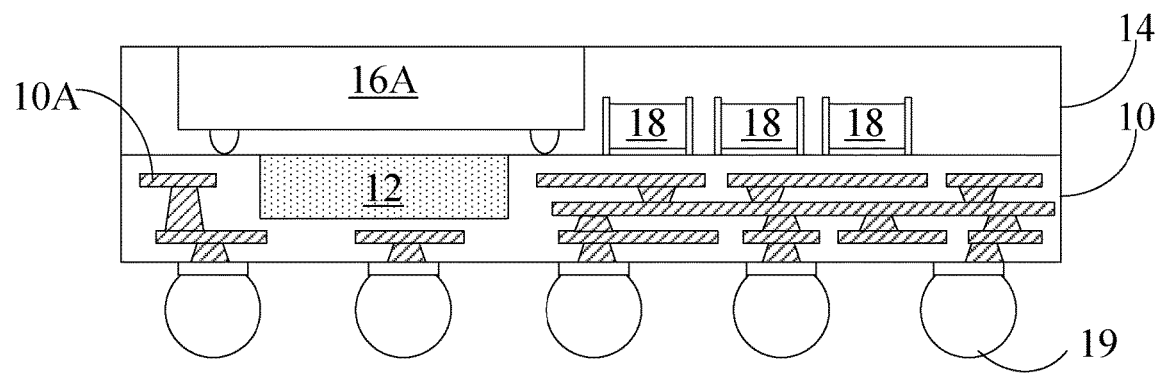

Finally, in FIG. 6F, solder balls 19 are placed on the bottom (second surface) of the redistribution layer 10 and electrically connected to the circuit layer 10A. The solder balls 19 can be implanted on the bottom of the redistribution layer 10 by ball implantation. The semiconductor package device according to an embodiment of the disclosure can be electrically connected to an external device (such as a printed circuit board) by these solder balls 19.

According to the embodiments of the disclosure, the heat dissipation efficiency of the semiconductor package device is improved by the thermal conductor. The thermal energy generated by the electronic device 16A is quickly dissipated through the thermal conductor. In addition, the stresses on the thermal conductor 10 are higher than those on the redistribution layer 10. The redistribution layer 12 being embedded with the thermal conductor 10 prevents the redistribution layer 12 from cracking, improving the reliability of the semiconductor products.

Many details are often found in the relevant art and many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A semiconductor package device comprising:
   a redistribution layer comprising a first surface defining an opening, a second surface opposite to the first surface, and a circuit layer;
   a thermal conductor disposed in the opening, and a bottom surface and a side surface of the thermal conductor contacting with the redistribution layer;
   an electronic device disposed on the first surface of the redistribution layer above the thermal conductor, and contacting with a top surface of the thermal conductor;
   an electronic component disposed on the first surface of the redistribution layer;
   a molding layer formed on the first surface, surrounding the electronic device and covering the electronic component; and
   a solder ball disposed on the second surface of the redistribution layer and electrically connected to the circuit layer,
   wherein the thermal conductor is separated from the circuit layer and the solder ball, and the solder ball is under the bottom surface of the thermal conductor.

2. The semiconductor package device of claim 1, wherein a material of the thermal conductor is copper, copper alloy, ceramic, graphene, graphite, carbon nanotube (CNT), or carbon nanospheres.

3. The semiconductor package device of claim 1, wherein the molding layer exposes a top surface of the electronic device, and cover a top surface of the electronic component.

4. The semiconductor package device of claim 1, wherein the thermal conductor extends beyond the first surface of the redistribution layer.

5. A semiconductor package device comprising:
   a redistribution layer comprising a first surface defining an opening, a second surface opposite to the first surface, and a circuit layer;
   a thermal conductor disposed in the opening, and a bottom surface and a side surface of the thermal conductor contacting with the redistribution layer;
   an electronic device disposed on the first surface of the redistribution layer and contacting with a top surface of the thermal conductor;
   a molding layer formed on the first surface, surrounding the electronic device; and
   a solder ball disposed on the second surface of the redistribution layer and electrically connected to the circuit layer,
   wherein the thermal conductor is separated from the circuit layer and the solder ball, and the solder ball is under the bottom surface of the thermal conductor.

6. The semiconductor package device of claim 5, wherein a material of the thermal conductor is copper, copper alloy, ceramic, graphene, graphite, carbon nanotube (CNT), or carbon nanospheres.

7. The semiconductor package device of claim 5, wherein the thermal conductor extends beyond the first surface of the redistribution layer.

8. A method of manufacturing a semiconductor package device, the method comprising:
   providing a redistribution layer comprising a first surface, a second surface opposite to the first surface, and a circuit layer;
   defining an opening with a bottom and a side wall on the first surface of the redistribution layer;
   disposing a thermal conductor in the opening wherein a bottom surface of the thermal conductor contacts with the bottom of the opening, and a side surface of the thermal conductor contacts with the side wall of the opening;
   disposing an electronic device on the first surface of the redistribution layer above the thermal conductor, and contacting with a top surface of the thermal conductor;

disposing an electronic component on the first surface of the redistribution layer;

forming a molding layer on the first surface and covering the electronic device and the electronic component;

polishing the molding layer to expose a top of the electronic device; and disposing a solder ball on the second surface of the redistribution layer under the bottom surface of the thermal conductor, and electrically connected to the circuit layer, wherein the thermal conductor is separated from the circuit layer and the solder ball.

9. The method of claim 8, wherein a material of the thermal conductor is copper, copper alloy, ceramic, graphene, graphite, carbon nanotube (CNT), or carbon nanospheres.

10. The method of claim 8, wherein the molding layer exposes from a top surface of the electronic device, and cover a top surface of the electronic component.

11. The method of claim 8, wherein the thermal conductor extends beyond the first surface the redistribution layer.

12. The method of claim 8, wherein the opening is formed by mechanical drilling, etching or laser drilling.

\* \* \* \* \*